United States Patent
Voth et al.

(10) Patent No.: US 6,526,465 B1
(45) Date of Patent: Feb. 25, 2003

(54) PCI AND COMPACTPCI INTEGRATION

(75) Inventors: David W. Voth, Woodinville, WA (US); Ray A. Bittner, Jr., Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/324,635

(22) Filed: Jun. 2, 1999

(51) Int. Cl.[7] ............................................. G06F 13/00
(52) U.S. Cl. ...................................................... 710/301
(58) Field of Search .............................. 710/301, 302; 361/748, 752, 760, 761

(56) References Cited

U.S. PATENT DOCUMENTS 6,185,110 B1 * 2/2001 Liu ............................. 361/829
6,209,051 B1 * 3/2001 Hill et al. ..................... 710/302

OTHER PUBLICATIONS

Stanley et al., *PCI System Architecture*, 3rd Edition, 1995, pp. 39–52.
PCI Local Bus Specification, Revison 2.2, 1998.
CompactPCI Specification, PICMG 2.0, Revision 2.1, Sep. 1997.

* cited by examiner

*Primary Examiner*—Glenn A. Auve
(74) *Attorney, Agent, or Firm*—Lee & Hayes, PLLC

(57) ABSTRACT

A computer system includes a centerplane formed by a printed circuit board. The centerplane has a plurality of Desktop PCI electrical connectors on one side and a plurality of CompactPCI electrical connectors on the other. This allows the use of both Desktop and CompactPCI boards in a signal bus board, without requiring complex bridging circuits. In addition, this allows additional boards to be used without extending the length of the PCI bus.

22 Claims, 2 Drawing Sheets

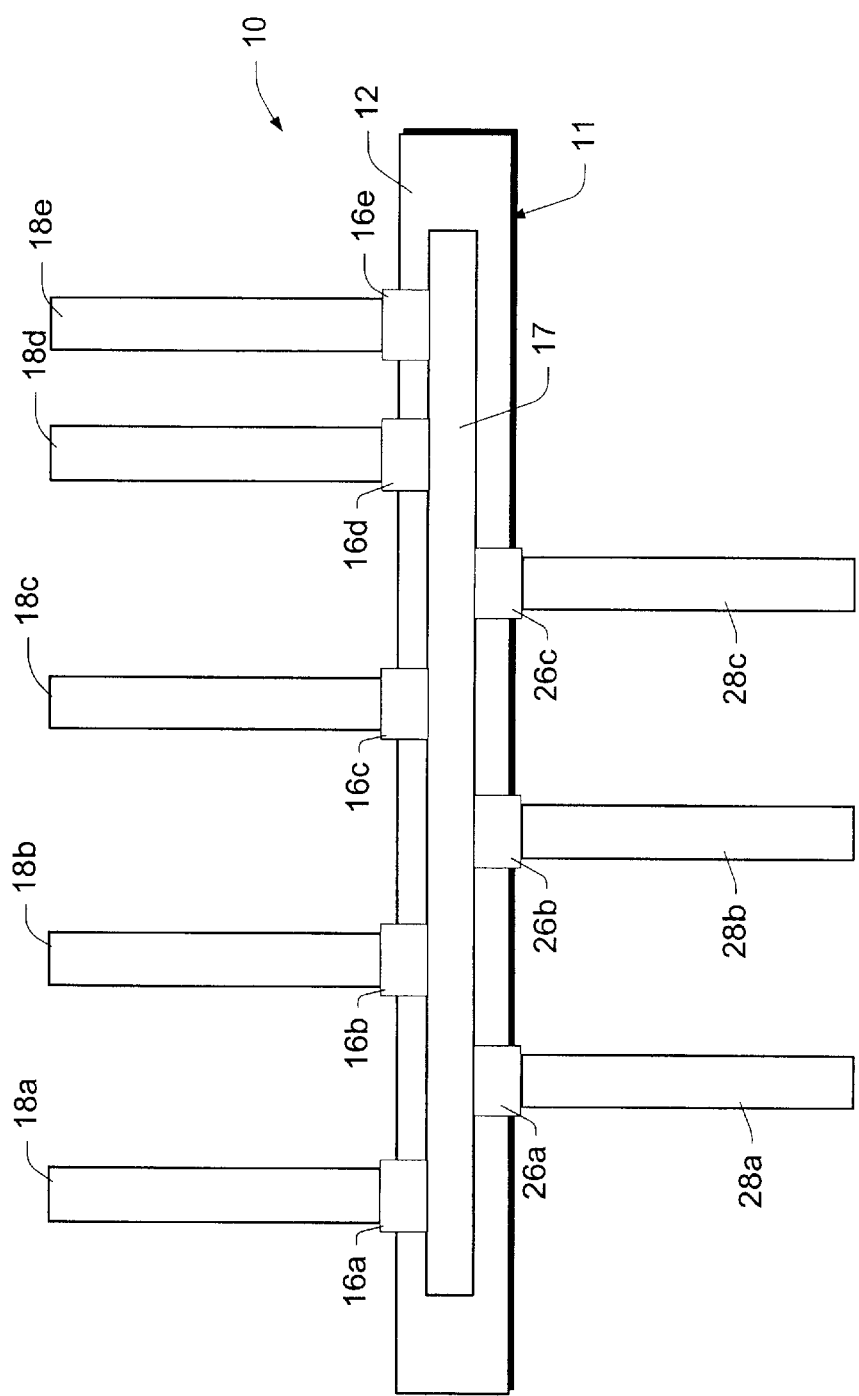

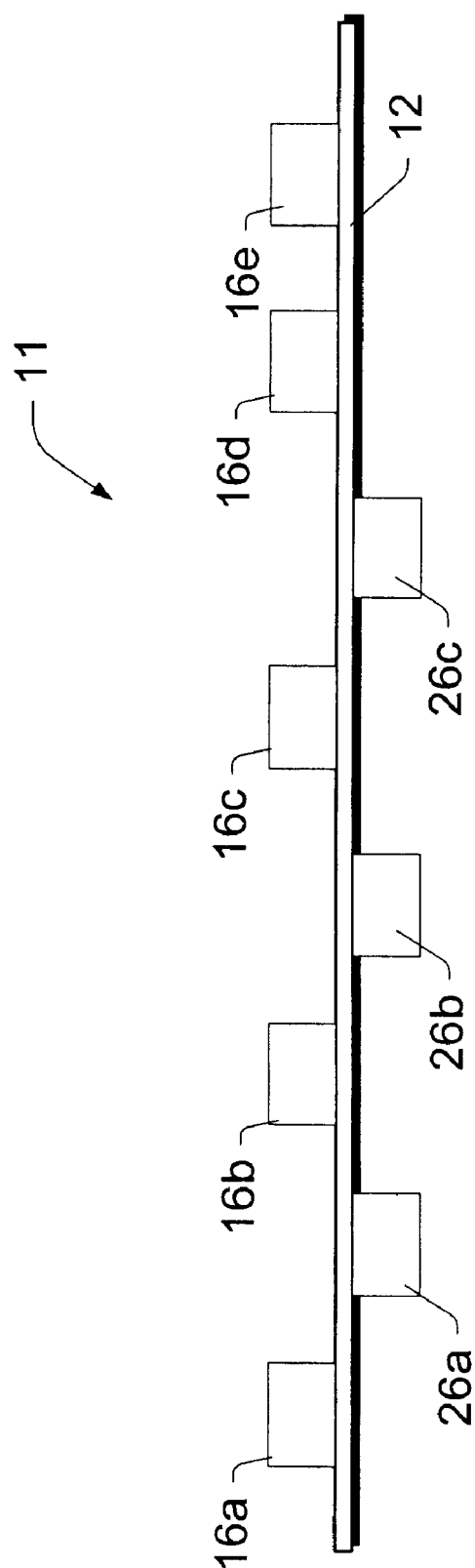

PCI AND COMPACTPCI INTEGRATION

TECHNICAL FIELD

The invention relates to PCI and CompactPCI bus systems.

BACKGROUND OF THE INVENTION

Modern communications systems typically utilize some type of electronic bus system to provide data communications between various computer components. A bus system is characterized in terms of a number of different properties, including electrical properties, timing properties, and data communication protocols.

Physically, a computer bus comprises a set of signal lines that extend in parallel between multiple peripheral connectors or "slots." Peripheral devices, sometimes referred to as "expansion cards," can be plugged into the peripheral connectors. Examples of such peripheral devices include memory devices, mass storage interface devices, sound cards, graphics cards, other I/O cards, etc.

In many cases, the bus is part of a so-called "motherboard," which incorporates a microprocessor and other components for controlling operations on the bus. In other cases, the bus is implemented as a passive "backplane," and controlling components are located on a peripheral device plugged into one of the peripheral connectors. The individual signal lines of the bus system are driven by components on the motherboard and/or by similar components on different peripheral devices.

The PCI (Peripheral Connection Interface) bus is one popular example of a computer bus. The PCI bus is used in popular personal computers, in conjunction with a motherboard. A processor and other base components of a computer are located on the motherboard, and peripheral components are installed in PCI connectors on the motherboard to customize a computer to a particular user's requirements. The PCI bus is a well known and widely accepted standard, defined in a document entitled "PCI Local Bus Specification". available from PCI Special Interest Group of Hillsboro, Oreg. The PCI bus will be referred to as the "Desktop" PCI bus in the following discussion.

The PCI bus satisfies the needs of a desktop computer, in which it finds its primary application. However, a variation of the PCI bus has also been adapted to more industrial environments. This variation, known under the trademarked term "CompactPCI". borrows the electrical specification of the Desktop PCI bus. As an additional electrical feature, it adds the ability to "hot swap" peripheral boards—to change boards without removing power.

A further feature of the CompactPCI bus is that it allows processor boards, referred to as "system" boards, to be plugged into the bus rather than residing on a motherboard. Thus, the CompactPCI bus is usually utilized in conjunction with a passive backplane, which accepts both peripheral boards and system boards. Physical specifications differ from those specified for the Desktop PCI bus; the sizes of peripheral boards and the connectors used are different. The CompactPCI bus uses a gas tight, high density pin-and-socket connector which meets the IEC-1076 international standard. This connector has a number of advantages, all of which are favorable to the use of the CompactPCI bus in industrial environments. CompactPCI boards have a form factor similar to that of the VME bus, which is another bus that is widely accepted in industrial control environments.

The CompactPCI bus is also well known and widely used, and is defined in a document entitled "CompactPCI Specification". available from PCI Industrial Computer Manufacturers Group (PICMG). PICMG is a consortium of industrial computer product vendors who collaboratively develop specifications for PCI-based systems and boards for use in industrial and telecommunications computing applications.

Prior to developing the invention, the inventors had proposed a development system based on the CompactPCI bus. This bus was desirable because it allowed different processor boards (and associated microprocessors) to be swapped in and out of the development system. Because of this, software developers would be able to use the development system to develop software for a system in which different microprocessors could be used.

A significant disadvantage of the CompactPCI bus, however, is that peripheral cards for this bus are less widely available and more expensive than Desktop PCI cards having the same functionality. Accordingly, the inventors realized that it would be desirable to be able to use Desktop PCI cards in the development system. Although bridging circuits were available for integrating CompactPCI and Desktop PCI buses, such circuits would have added expense, size, and complexity which the inventors wished to avoid. On the other hand, a non-bridged bus designed to accommodate a useful number of both CompactPCI and Desktop PCI peripheral cards would likely either violate PCI timing specifications or run at a reduced clock speed.

SUMMARY OF THE INVENTION

In accordance with the invention, a CompactPCI bus is implemented on a passive centerplane. CompactPCI connectors are positioned on one side of the centerplane. Desktop PCI connectors are placed on the other side. Both types of connectors are connected directly to a common electrical bus, which complies with the CompactPCI standard. This is possible because the Desktop and CompactPCI buses share common electrical characteristics. Rather than laying out the connectors side-by-side on a single side of the centerplane, the PCI and CompactPCI connectors are interleaved by placing them on opposite sides of the centerplane. Due to the mechanical restrictions of placing the connectors side-by-side, interleaving the connectors on opposite sides of the centerplane conserves space, allowing five Desktop PCI peripheral cards and three CompactPCI peripheral cards to be plugged into a single centerplane. The CompactPCI system slot board may be one to three units wide, while the CompactPCI peripheral slot boards may be one to two units wide. This design allows as many as eight PCI (CompactPCI or Desktop) peripheral cards to reside on the same bus, meeting PCI Electrical and physical requirements without requiring active bridging circuits.

BRIEF DESCRIPTION OF THE DRAWINGS

FIG. 1 is a conceptual representation of a computer system in accordance with the described embodiment of the invention.

FIG. 2 is a physical representation of a centerplane in accordance with the invention.

DETAILED DESCRIPTION

FIG. 1 provides a conceptual illustration of a computer system 10 in accordance with the invention. FIG. 2 shows a physical representation of a centerplane 11 used in the same system. The same reference numerals are used in each figure to indicate the same components.

The system comprises a centerplane 11 formed by a printed circuit board 12 and a plurality of connectors 16 (i.e., 16a, 16b, 16c, 16d, 16e) and 26 (i.e., 26a, 26b, 26c). As used herein, the term "centerplane" refers to a circuit board having at least two opposing sides with connectors for receiving peripheral boards on both of the opposing sides. The printed circuit board has a plurality of signal lines that form a data communications bus 17 (shown in FIG. 1). In the described embodiment, the communications bus is designed to satisfy the CompactPCI electrical specification. Since the CompactPCI specification has signal lines that are a superset of the signal lines of the Desktop PCI specification, this bus structure satisfies both the Desktop PCI electrical specification and the CompactPCI electrical specification.

A plurality of Desktop PCI electrical connectors 16 are placed on one side of the centerplane to receive Desktop PCI peripheral boards 18 (i.e., 18a, 18b, 18c, 18d, 18e). Each connector 16 complies with the Desktop PCI specification, and has individual contacts that are electrically connected to corresponding signal lines of data communications bus 17. Peripheral boards 18 have contacts that mate with the contacts of connectors 16, thereby providing electrical connections between peripheral boards 18 and data communications bus 17. In the illustrated embodiment, five Desktop PCI electrical connectors are positioned on the centerplane, and are spaced from each other in accordance with Desktop PCI standards.

A plurality of CompactPCI electrical connectors 26 (i.e., 26a, 26b, 26c) are placed on the opposite side of the centerplane to receive CompactPCI peripheral boards 28 (i.e., 28a, 28b, 28c). Each connector 26 complies with the CompactPCI specification, and has individual contacts that are electrically connected to corresponding signal lines of data communications bus 17. Peripheral boards 28 have contacts that mate with the contacts of connectors 26, thereby providing electrical connections between peripheral boards 28 and data communications bus 17. In the illustrated embodiment, three CompactPCI electrical connectors are positioned on the centerplane, and are spaced from each other in accordance with CompactPCI standards.

Printed circuit board 12 is preferably a multi-layer board, so any signal lines of data communications bus 17 can be routed as to appropriate connector contacts. In practice, the physical arrangement of signal lines in the Desktop and CompactPCI connectors is similar, so that complex routing is not necessary. As when designing any bus structure, it is important to keep signal lines as short as possible, and thus avoid any unnecessary routing detours.

One of CompactPCI connectors 26 is designated as a system slot, and appropriate wiring connections are made for this connector in accordance with the CompactPCI standard. A system board or card, containing a microprocessor, is normally plugged into this slot.

Appropriate bus terminations are provided on circuit board 12, in accordance with the CompactPCI standards. In most cases, this involves clamping diodes (not shown) at each end of each signal line.

Along the length of the bus, the connectors are staggered or interleaved on opposite sides of the circuit board 12, so that each CompactPCI connector 26 is positioned linearly between adjacent Desktop PCI connectors 16.

The particular positioning of the different types of PCI connectors allows Desktop PCI and CompactPCI boards to be used with a single bus board, while keeping the overall length of the bus within the limits set by the PCI electrical specifications. In addition, this arrangement allows as many as eight boards to be used on the opposite sides of the centerplane, without requiring active bridging circuits and the accompanying complexities. Furthermore, the design allows bus signals of at least 33 MHz, as specified by the PCI and CompactPCI standards.

More specifically, the described embodiment includes one 3-wide CompactPCI system slot, two 2-wide CompactPCI I/O slots, and five Desktop PCI slots. All eight slots utilize a single centerplane without active bridging circuitry, while still meeting PCI electrical and physical specifications.

The ability to mix Desktop and CompactPCI boards is a tremendous advantage in a development system; CompactPCI boards allow a designer to test different microprocessors boards in a given system, while Desktop PCI boards allow the use and testing of more inexpensive peripheral components.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A computer system comprising:
    a printed circuit board having a plurality of signal lines forming a data communications bus that satisfies both Desktop PCI (Peripheral Connection Interface) and CompactPCI® electrical specifications;
    a plurality of Desktop PCI electrical connectors on the printed circuit board to connect Desktop PCI peripheral boards to the data communications bus;
    a plurality of CompactPCI electrical connectors on the printed circuit board to connect CompactPCI peripheral boards to the data communications bus.

2. A system as recited in claim 1, further comprising:
    a plurality of Desktop PCI peripheral boards connected to the data communications bus through the Desktop PCI electrical connectors;
    a plurality of CompactPCI peripheral boards connected to the data communications bus through the CompactPCI electrical connectors.

3. A system as recited in claim 1, further comprising:
    a plurality of Desktop PCI peripheral boards connected to the data communications bus through the Desktop PCI electrical connectors;
    a plurality of CompactPCI peripheral boards connected to the data communications bus through the CompactPCI electrical connectors;
    wherein at least one of the CompactPCI peripheral boards is a system board.

4. A system as recited in claim 1, wherein the Desktop PCI electrical connectors are on opposite sides of the printed circuit board and the CompactPCI electrical connectors are on opposite sides of the printed circuit board.

5. A system as recited in claim 1, wherein the electrical connectors are interleaved on opposite sides of the printed circuit board.

6. A system as recited in claim 1, wherein the printed circuit board has first and second sides, and wherein:
    the Desktop PCI electrical connectors are on the first side; and
    the CompactPCI electrical connectors are on the second side.

7. A system as recited in claim 1, wherein the printed circuit board has first and second sides, and wherein:

the Desktop PCI electrical connectors are on the first side;

the CompactPCI electrical connectors are on the second side; and the connectors are interleaved with each other on the first and second sides to conserve space.

8. A system as recited in claim 1, wherein the system does not contain active bridging circuitry between the electrical connectors.

9. A system as recited in claim 1, wherein the system does not contain active bridging circuitry between the electrical connectors and is capable of bus signals of at least 33 MHz.

10. A system as recited in claim 1, wherein the system does not contain active bridging circuitry between the Desktop PCI and the CompactPCI electrical connectors.

11. A computer centerplane comprising:

a printed circuit board having a plurality of signal lines forming a data communications bus that satisfies both Desktop PCI (Peripheral Connection Interface) and CompactPCI® electrical specifications;

the printed circuit board having first and second sides;

a plurality of Desktop PCI electrical connectors on the first side of the printed circuit board to connect Desktop PCI peripheral boards to the data communications bus;

a plurality of CompactPCI electrical connectors on the second side of the printed circuit board to connect CompactPCI peripheral boards to the data communications bus.

12. A computer centerplane as recited in claim 11, wherein the electrical connectors are interleaved on the first and second sides of the printed circuit board.

13. A computer centerplane as recited in claim 11, wherein the centerplane does not have active bridging circuitry between the electrical connectors.

14. A computer centerplane as recited in claim 11, wherein the centerplane does not have active bridging circuitry between the electrical connectors and is capable of bus signals of at least 33 MHz.

15. A computer centerplane as recited in claim 11, wherein the centerplane does not have active bridging circuitry between the Desktop PCI and the CompactPCI electrical connectors.

16. A computer system comprising:

a printed circuit board;

a plurality of Desktop PCI (Peripheral Connection Interface) electrical connectors on one side of the printed circuit board to connect Desktop PCI peripheral boards, wherein the Desktop PCI electrical connectors and peripheral boards are characterized by a Desktop PCI specification that does not provide for connecting system boards through the Desktop PCI electrical connectors;

a plurality of CompactPCI electrical connectors on another side of the printed circuit board to connect CompactPCI peripheral boards, wherein the CompactPCI electrical connectors and peripheral boards are characterized by a CompactPCI specification that does provide for connecting system boards through the CompactPCI electrical connectors;

a data communications bus that extends between both the Desktop PCI electrical connectors and the CompactPCI electrical connectors, the data communications bus having electrical characteristics that satisfy the CompactPCI specification, and which thereby provide for connecting a system board through one of the CompactPCI electrical connectors;

the computer system thereby allowing both Desktop PCI boards and CompactPCI boards to operate on the same data communications bus.

17. A system as recited in claim 16, further comprising:

a plurality of Desktop PCI peripheral boards connected to the data communications bus through the Desktop PCI electrical connectors;

a plurality of CompactPCI peripheral boards connected to the data communications bus through the CompactPCI electrical connectors.

18. A system as recited in claim 16, further comprising:

a plurality of Desktop PCI peripheral boards connected to the data communications bus through the Desktop PCI electrical connectors;

a plurality of CompactPCI peripheral boards connected to the data communications bus through the CompactPCI electrical connectors;

a CompactPCI peripheral system board connected to the data communications bus through the CompactPCI electrical connectors.

19. A system as recited in claim 16, wherein the electrical connectors are interleaved on both sides of the printed circuit board.

20. A system as recited in claim 16, wherein the printed circuit board does not have active bridging circuitry between the electrical connectors.

21. A system as recited in claim 16, wherein the printed circuit board does not have active bridging circuitry between the electrical connectors and the system is capable of bus signals of at least 33 MHz.

22. A system as recited in claim 16, wherein the printed circuit board does not have active bridging circuitry between the Desktop PCI and the CompactPCI electrical connectors.

* * * * *